(12) United States Patent
Chen et al.

(10) Patent No.: US 6,365,444 B2
(45) Date of Patent: Apr. 2, 2002

(54) PROCESS FOR FORMING POLYCRYSTALLINE THIN FILM TRANSISTOR LIQUID CRYSTAL DISPLAY

(75) Inventors: Chih-Chang Chen; Jerry Ji-Ho Kung, both of Taoyuan Hsien (TW)

(73) Assignee: Hannstar Display Corp. (TW)

( * ) Notice: Subject to any disclaimer, the term of this patent is extended or adjusted under 35 U.S.C. 154(b) by 0 days.

(21) Appl. No.: 09/812,106

(22) Filed: Mar. 19, 2001

(30) Foreign Application Priority Data

Jun. 30, 2000 (TW) ....................................... 89113053 A

(51) Int. Cl.$^7$ .............................................. H01L 21/00
(52) U.S. Cl. ........................ 438/149; 438/404; 438/424; 438/153; 438/154
(58) Field of Search ................................. 438/149, 404, 438/424, 153, 154, 157, 159, 308, 713, 766, 798, 477, 166, 142, 151; 257/57, 59, 69, 72

(56) References Cited

U.S. PATENT DOCUMENTS

| | | | | |
|---|---|---|---|---|
| 5,595,944 A | * | 1/1997 | Zhang et al. | 437/41 |
| 5,606,179 A | * | 2/1997 | Yamazaki et al. | 257/59 |
| 5,977,559 A | * | 11/1999 | Zhang et al. | 257/57 |
| 6,027,987 A | * | 2/2000 | Yamazaki et al. | 438/486 |
| 6,063,654 A | * | 5/2000 | Ohtani | 438/166 |
| 6,166,397 A | * | 12/2000 | Yamazaki et al. | 257/59 |
| 6,218,219 B1 | * | 4/2001 | Yamazaki et al. | 438/149 |
| 6,300,659 B1 | * | 10/2001 | Zhang et al. | 257/347 |

* cited by examiner

Primary Examiner—Keith Christiansen
Assistant Examiner—Laura M Schillinger
(74) Attorney, Agent, or Firm—Peter F. Corless; Edward & Angell, LLP

(57) ABSTRACT

A process for forming a polycrystalline TFT LCD is provided, thereby greatly reducing the manufacturing cost and time. The process includes steps of performing a first masking procedure to define a gate conductive region, successively forming an insulation layer, an amorphous channel semiconductor layer, a catalytic layer and a doped semiconductor layer, performing a second masking procedure to remove portions of the semiconductor layer and the catalytic layer to define an electrode region, performing a thermal treatment to respectively convert the electrode region and the amorphous semiconductor channel layer into a source/drain region and a crystalline semiconductor channel layer by the catalytic layer, performing a third masking procedure to define data lines, performing a fourth masking procedure to form a contact hole, and performing a fifth masking procedure to define a transparent pixel electrode region, thereby forming the TFT.

12 Claims, 6 Drawing Sheets

PROCESS FOR FORMING POLYCRYSTALLINE THIN FILM TRANSISTOR LIQUID CRYSTAL DISPLAY

FIELD OF THE INVENTION

The present invention relates to a process for forming a thin film transistor-liquid crystal display (TFT-LCD), and more particularly to a process for forming a complementary poly-silicon TFT-LCD.

BACKGROUND OF THE INVENTION

In the conventional process for fabricating TFT-LCD (thin film transistor liquid crystal display), the semiconductor materials such as the channel layer and the source/drain layer of the active matrix switch are usually made of intrinsic amorphous silicon and highly doped amorphous silicon respectively. Due to the low conductivity of the amorphous silicon material, the driving current ability of the amorphous silicon material can not meet the requirement of the LCD peripheral driving circuit. Therefore, the semiconductor material layer made of the intrinsic poly-silicon and highly doped poly-silicon has better conductivity and is easily to be assembled with the LCD device. The conventional process for TFT-LCD properly is complicated, hence, it is better way to achieve the TFTs and the LCD peripheral driving circuit at the same time.

The TFTs and the LCD peripheral driving circuit are principally composed of the P-type and the N-type poly-silicon TFTs. As shown in FIGS. 1(a) to 1(f), the conventional steps for forming a complementary poly-silicon TFT including the P-type and N-type poly-silicon TFT and the peripheral driving circuit by employing eight masking and patterning process steps.

In view of FIG. 1(a), a silicon oxide (SiOx) barrier layer 11 and a poly-silicon layer on a glass substrate 10 are formed and a first masking and patterning procedure is performed to define a ploy-silicon channel layer 12 on the poly-silicon layer.

In view of FIG. 1(b), a gate insulation material structure and a gate conductive material structure are successively formed and a second masking and patterning procedure is performed to define a gate insulation layer 13 and a gate conductive layer 14 respectively.

Referring to FIG. 1(c), a third masking and patterning procedure is proceeded and then an N-type ion-implanting procedure is performed on the exposed portions of a poly-silicon channel layer 12 uncovered with a photoresist 15 for forming a source/drain region 121 of an N-type poly-silicon TFT.

Referring to FIG. 1(d), a fourth masking and patterning procedure is proceeded and then a P-type ion-implanting procedure is performed on the exposed portions of a poly-silicon channel layer 12 uncovered with a photoresist 16 for forming a source/drain region 122 of a P-type poly-silicon TFT.

As for FIG. 1(e), a silicon oxide interlayer 17 is formed and a fifth masking and patterning procedure is performed to define a contact hole 18.

With regard to FIG. 1(f), a metal conductive layer is formed and a sixth masking and patterning procedure is performed to define a source/drain conductive layer 19. Subsequently, a seventh and an eighth masking and patterning procedures are proceeded to define a passivation layer and a transparent electrode layer (not shown in Figure) respectively.

Thus, the above-mentioned conventional process has disadvantages of high manufacturing cost and time-consuming by using eight masking and patterning procedures. It is therefore tried by the applicant to deal with the above situation encountered by the prior art.

SUMMARY OF THE INVENTION

It is therefore an object of the present invention to provide a process for forming a poly-silicon TFT-LCD with reduced masking and patterning steps.

It is another object of the present invention to provide a process for forming a poly-silicon TFT-LCD to reduce the manufacturing cost and the procedure time.

According to the present invention, there is provided the process for forming a thin film transistor (TFT) liquid crystal display (LCD). The process includes steps of providing a substrate made of an insulating material, forming a first conductive layer on the substrate, performing a first masking and patterning procedure to define a gate conductive region on the substrate, successively forming an insulation layer, an amorphous semiconductor channel layer, a catalytic layer and a doped semiconductor layer on the substrate, performing a second masking and patterning procedure to remove portions of the doped semiconductor layer and the catalytic layer to define an electrode region, performing a thermal treatment for the substrate to respectively convert the electrode region and the amorphous semiconductor channel layer into a source/drain region and a crystalline semiconductor channel layer by the catalytic layer, forming a second conductive layer on the substrate and performing a third masking and patterning procedure to define data lines, forming a passivation layer and performing a fourth masking and patterning procedure to remove portions of the passivation for forming a contact hole accessible to the data line, and forming a transparent electrode layer and performing a fifth masking and patterning procedure to define a transparent pixel electrode region, thereby forming the thin film transistor.

Preferably, the first conductive layer is a gate conductive layer.

Preferably, the amorphous semiconductor channel layer is formed of intrinsic amorphous silicon and the doped semiconductor layer is formed of highly doped amorphous silicon.

Preferably, the catalytic layer is formed of a catalytic metal.

Preferably the catalytic metal is formed of Nickel.

Preferably the thermal treatment is an annealing procedure for heating 4 hours at 550° C. under one of a hydrogen atmosphere and an inert gas atmosphere.

According to a further aspect of the present invention, there is provided a process for forming a complementary TFT LCD. The process includes steps of providing a substrate made of an insulating material, forming a first conductive layer on the substrate, performing a first masking and patterning procedure to define two gate conductive regions on the substrate, successively forming an insulation layer, an amorphous semiconductor channel layer, a catalytic layer, an N-type doped amorphous semiconductor layer on the substrate, performing a second masking and patterning procedure to remove portions of the N-type doped amorphous semiconductor layer and the catalytic layer to define a first electrode region and a second electrode region, forming a photoresist layer and performing a third masking and patterning procedure to expose the second electrode region, performing a P-type doping procedure to convert the materials of the second electrode region into a P-type doped amorphous semiconductor, performing a thermal treatment for the substrate to convert the first electrode region and the second electrode region and the amorphous semiconductor channel layer into a first source/drain region, a second source/drain region and a crystalline semiconductor layer by the catalytic layer, forming a second conductive layer and performing a fourth masking and patterning procedure to define data lines, forming a passivation layer and performing a fifth masking and patterning procedure to remove portions of the passivation layer to form a contact hole accessible to the data lines, forming a transparent electrode layer and performing a sixth masking and patterning procedure to form a transparent pixel region, thereby forming the complementary TFT.

According to a still aspect of the present invention, there is provided a process for forming a complementary TFT-LCD. The process includes steps of providing a substrate made of an insulating material, forming a first conductive layer on the substrate, performing a first masking and patterning procedure to define two gate conductive regions on the substrate, successively forming an insulation layer, an amorphous semiconductor channel layer, a catalytic layer, a P-type doped amorphous semiconductor layer on the substrate, performing a second masking and patterning procedure to remove portions of the P-type doped amorphous semiconductor layer and the catalytic layer to define a first electrode region and a second electrode region, forming a photoresist layer and performing a third masking and patterning procedure to expose the second electrode region, performing an N-type doping procedure to convert the materials of the second electrode region into an N-type doped amorphous semiconductor, performing a thermal treatment for the substrate to convert the first electrode region and the second electrode region and the amorphous semiconductor channel layer into a first source/drain region, a second source/drain region and a crystalline semiconductor layer by the catalytic layer, forming a second conductive layer and performing a fourth masking and patterning procedure to define data lines, forming a passivation layer and performing a fifth masking and patterning procedure to remove portions of the passivation layer to form a contact hole accessible to the data lines, forming a transparent electrode layer and performing a sixth masking and patterning procedure to form a transparent pixel region, thereby forming the complementary TFT.

The present invention may best be understood through the following descriptions with reference to the accompanying drawings, in which:

DETAILED DESCRIPTION OF THE PREFERRED EMBODIMENTS

FIGS. 2(a) to 2(e) shows a process for forming a poly-silicon complementary TFT LCD according to a preferred embodiment of the present invention.

Figure 1A:
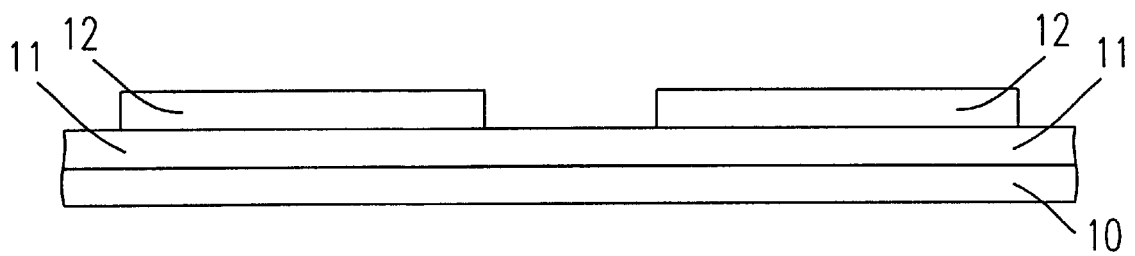
FIGS. 1(a) to 1(f) illustrate steps for forming a complementary poly-silicon TFT LCD according to prior art.
Figure 1B:
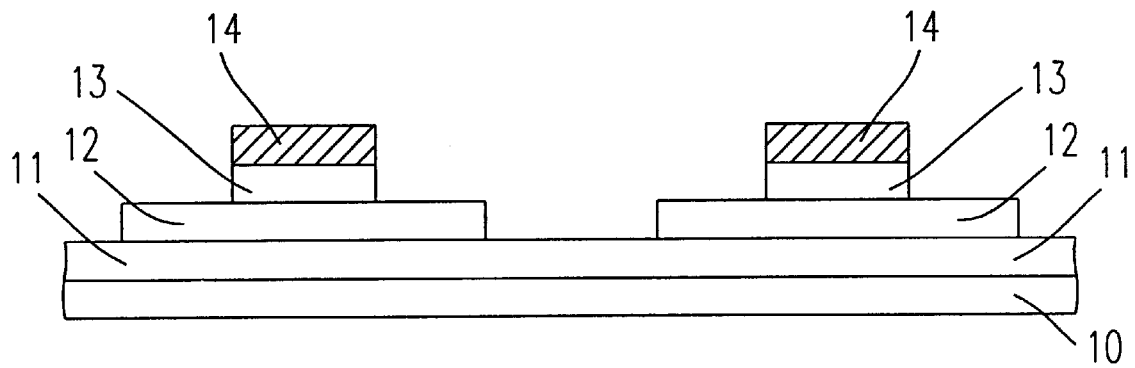
Figure 1C:
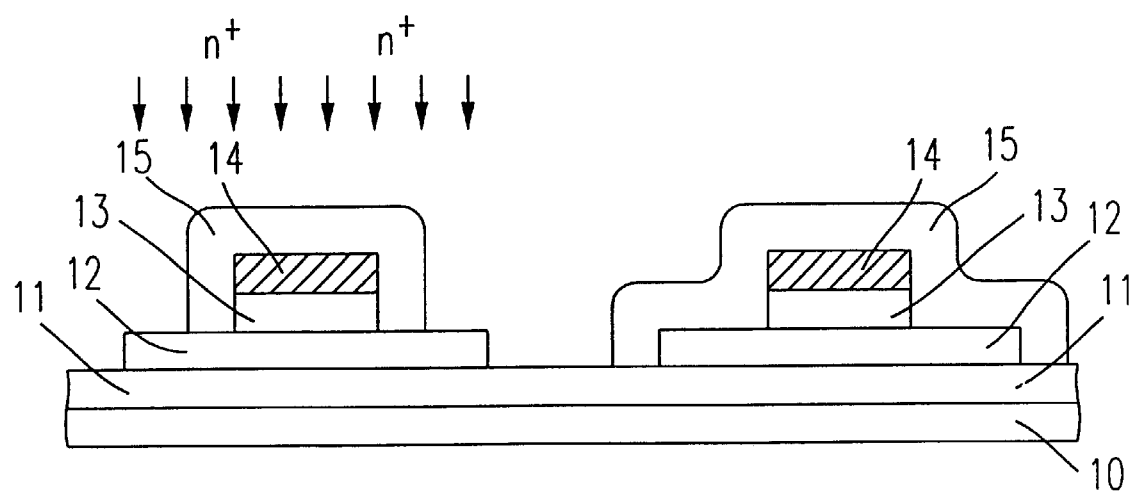
Figure 1D:
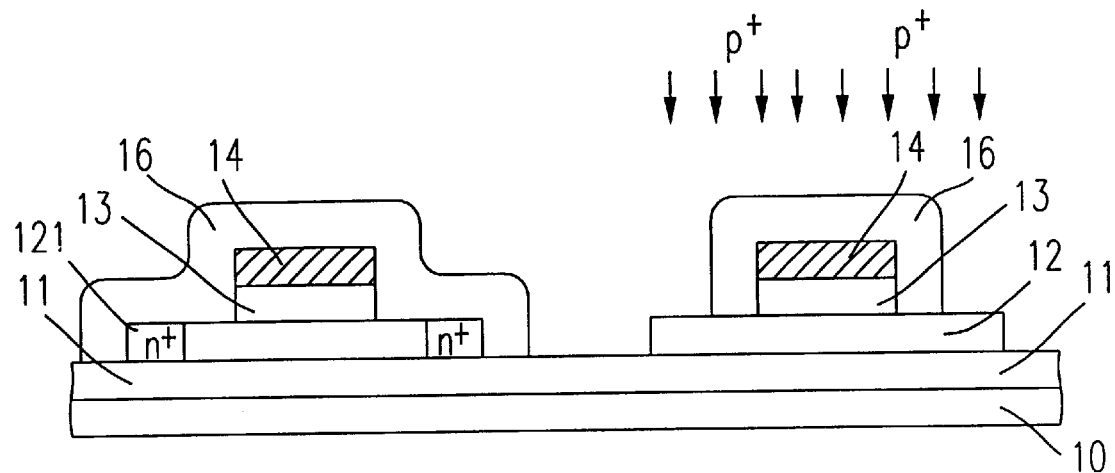
Figure 1E:
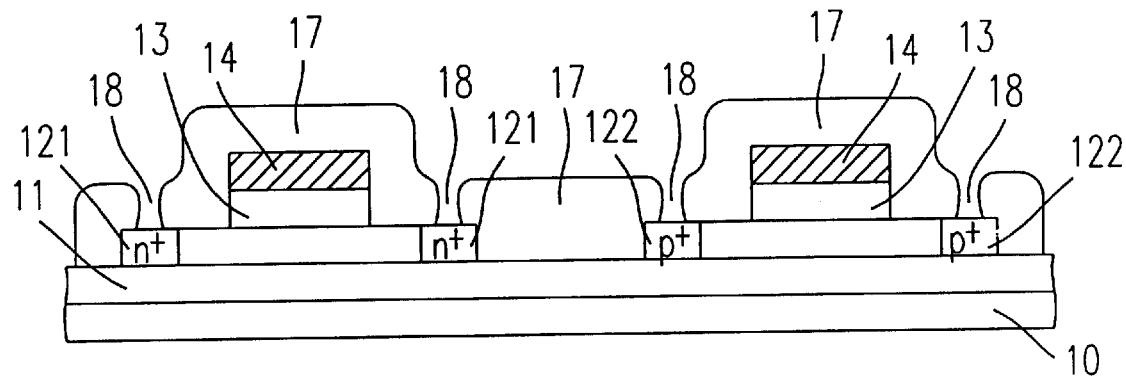
Figure 1F:
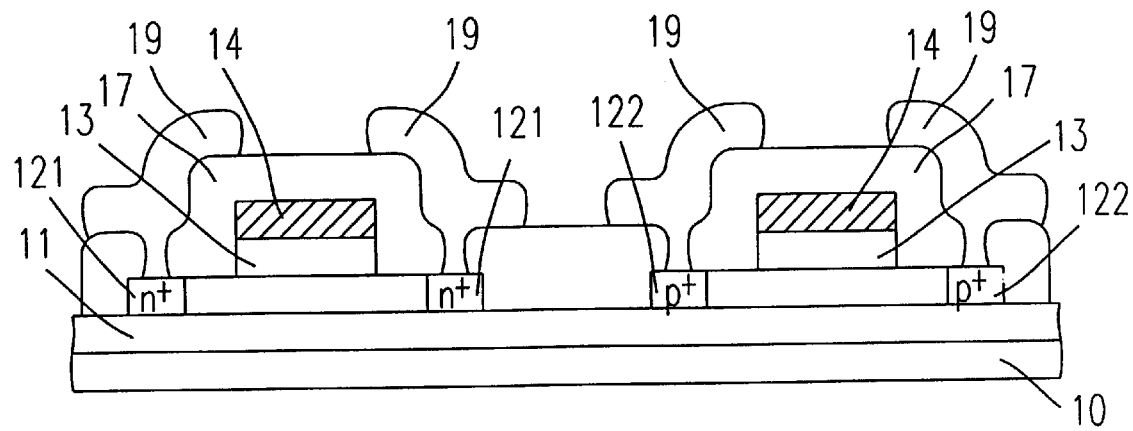
Figure 2A:
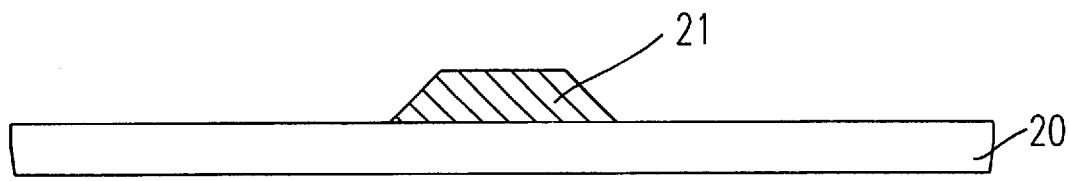
FIGS. 2(a) to 2(e) illustrate steps for forming a poly-silicon TFT LCD according to a preferred embodiment of the present invention.

Referring to FIG. 2(a), a gate conductive layer is formed on an insulation substrate 20 and then a first masking and patterning procedure is performed to define a gate conductive region 21.

Figure 2B:
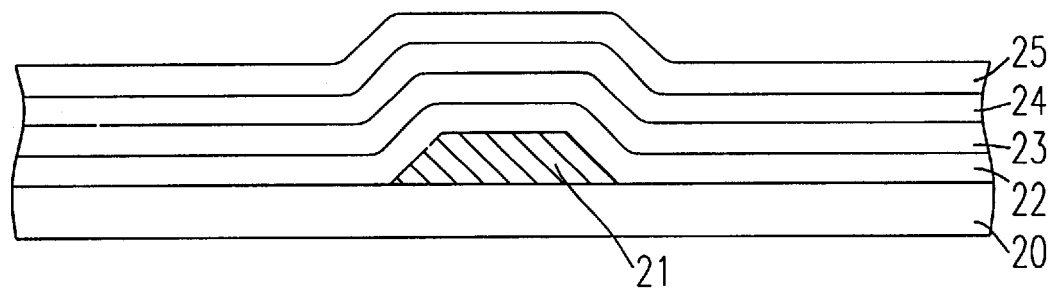

In view of FIG. 2(b), a gate insulation layer 22, an amorphous semiconductor layer 23, a catalytic layer 24 and a highly doped amorphous semiconductor source/drain layer 25 are successively formed.

Figure 2C:
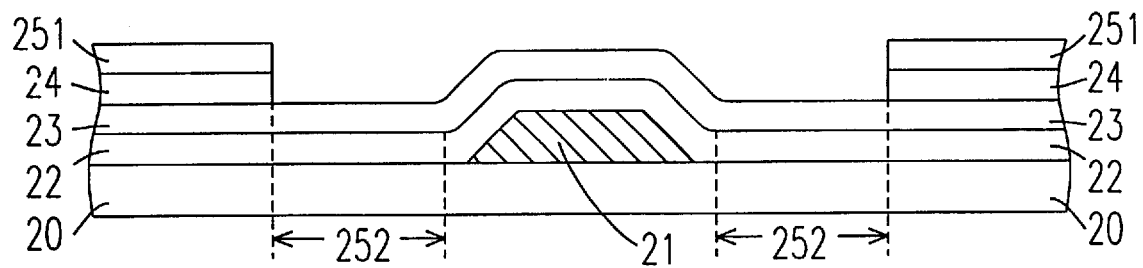

Then, a second masking and patterning procedure is performed to remove portions of the highly doped amorphous semiconductor source/drain layer 25 and the catalytic layer 24 owing to the high selective etching ratio between the highly doped amorphous semiconductor source/drain layer 25 and the catalytic layer 24, and further to define a source/drain structure 251, as shown in FIG. 2(c), wherein an offset structure 252 is provided for reducing leakage current of the foregoing components.

Figure 2D:
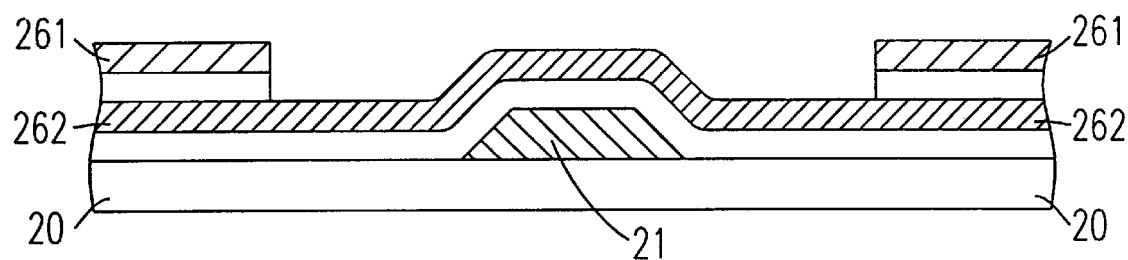

Subsequently, a thermal treatment for the overall processed substrate structure is performed to respectively convert the source/drain structure 251 and the amorphous semiconductor channel layer 23 into a poly-silicon source/drain structure 261 and a poly-silicon semiconductor channel layer 262 by means of a catalytic reaction generated by the catalytic layer 24, as shown in FIG. 2(d).

When the amorphous semiconductor channel layer 23 is a highly doped amorphous silicon, the material of the catalytic layer 24 is formed of a nickel-containing catalytic metal, and the thermal treatment is an annealing procedure for heating 4 hours at 550° C. under an atmosphere of a hydrogen gas or an inert gas.

Figure 2E:
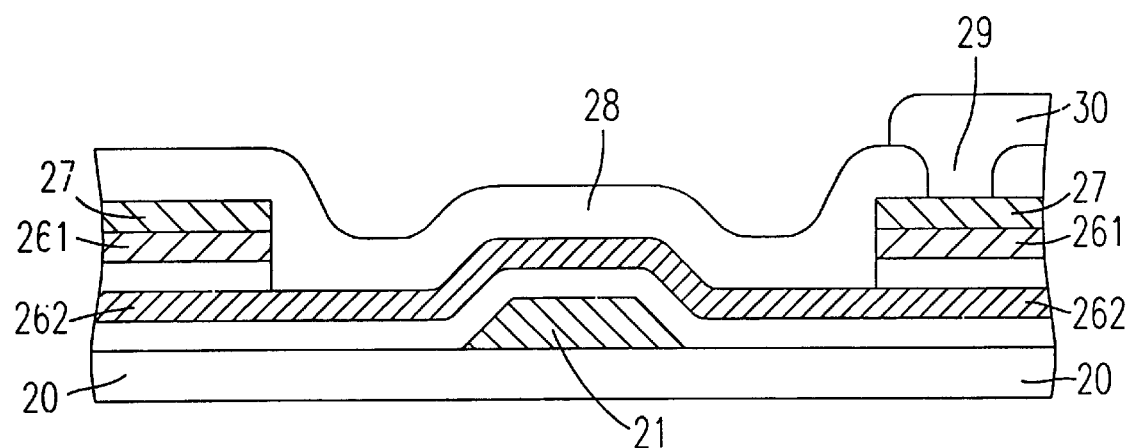

Please refer to FIG. 2(e), a data conductive layer is formed and then a third masking and patterning procedure is performed to define a data line structure 27. Subsequently, a passivation layer 28 is formed and a fourth masking and patterning procedure is performed to define a contact hole 29 on the passivation layer 28. Finally, a transparent electrode layer is formed and a fifth masking and patterning procedure is performed to define a transparent pixel electrode region 30, thereby forming a polycrystalline thin film transistor display panel.

Certainly, the present invention is also suitable to form the poly-silicon layer at a lower temperature. Thus, the temperature of manufacturing process could be effectively reduced to increase the flexible of the procedure materials.

FIGS. 3(a) to 3(f) shows a process for forming a complementary poly-silicon TFT according to another embodiment of the present invention. Only six masking and patterning procedures are used in this embodiment.

Figure 3A:
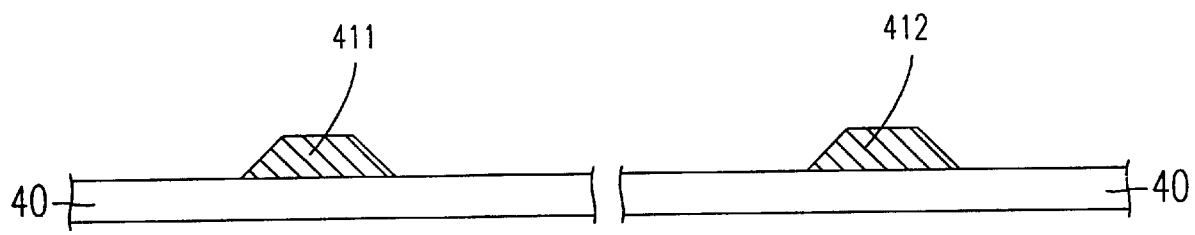
FIGS. 3(a) to 3(f) illustrate steps for forming a complementary poly-silicon TFT LCD according to another preferred embodiment of the present invention.

Referring to FIG. 3(a), a first masking step and patterning procedure is performed to define two gate conductive structures 411 and 412 after forming a gate conductive layer on an insulating substrate 40.

Figure 3B:
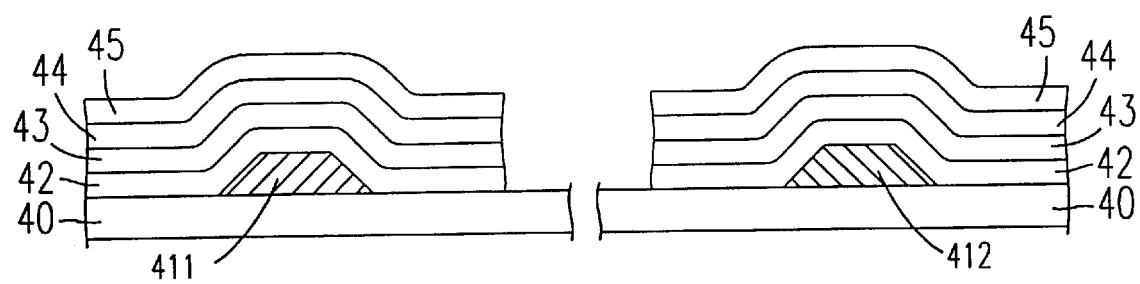

Then, a gate insulation layer 42, an amorphous semiconductor channel layer 43, a catalytic layer 44 and an N-type (P-type) highly doped semiconductor source/drain layer 45 are successively formed, as can be seen in FIG. 3(b).

Figure 3C:
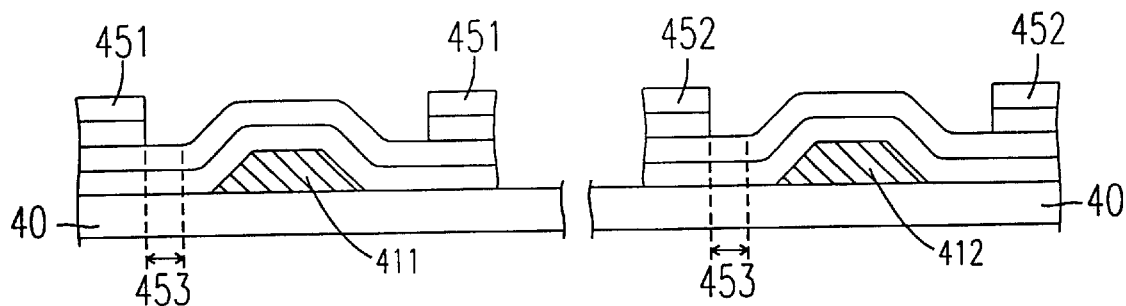

Subsequently, a second masking and patterning procedure is performed to successively remove portions of the N-type (P-type) highly doped semiconductor source/drain layer 45 and the catalytic layer 44 by the high selective etching ratio between the catalytic layer 44 and the amorphous semiconductor channel layer 43, and further define a first source/drain primitive structure 451 and a second source/drain primitive structure 452, as shown in FIG. 3(c). Then, an offset structure 453 shown in FIG. 3(c) is provided for reducing the leakage current of the foregoing semiconductor components.

Figure 3D:
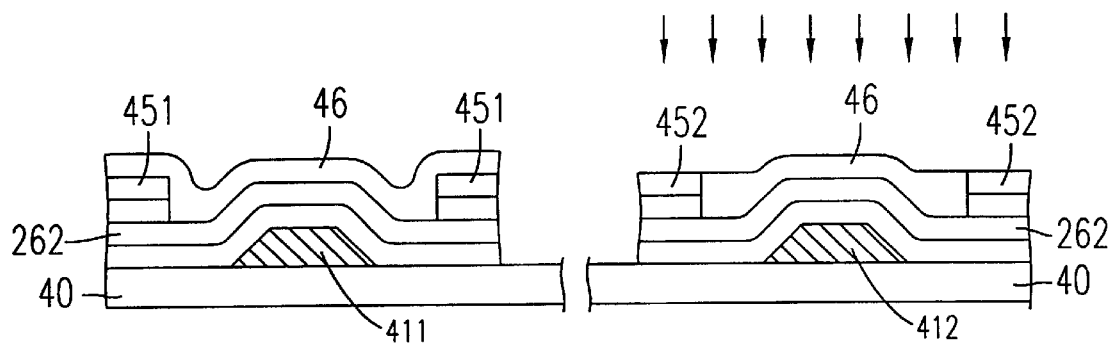

Referring to FIG. 3(d), a photoresist layer 46 is applied and a third masking and patterning procedure is performed to expose the second source/drain primitive structure 452. Then, a P-type (N-type) highly doping procedure is proceeded to convert the materials of the second source/drain primitive structure 452 into a P-type (N-type) highly doped amorphous semiconductor.

Figure 3E:
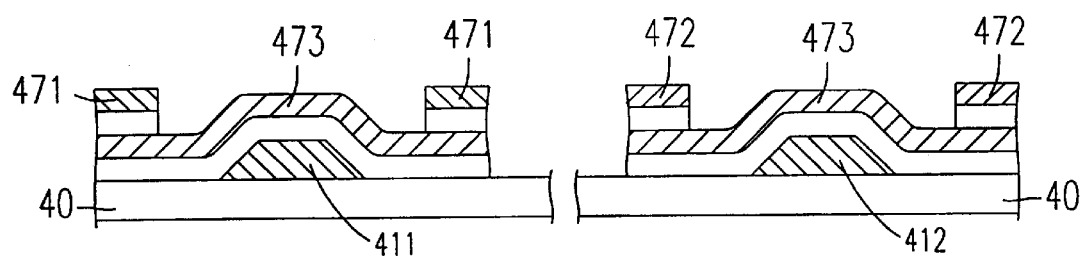

A thermal treatment for the overall processed substrate structure is performed to crystallize the materials of the first source/drain primitive structure 451, the second source/drain primitive structure 452 and the amorphous semiconductor channel layer 43, which are further converted into a first polycrystalline source/drain structure 471, a second polycrystalline source/drain structure 472 and a polycrystalline semiconductor channel layer 473, as can be seen in FIG. 3(e).

When the amorphous semiconductor channel layer 43 is an intrinsic amorphous silicon and the N-type (P-type) highly doped amorphous semiconductor source/drain layer 45 is an N-type (P-type) highly doped amorphous silicon, the material of the catalytic layer is formed of a nickel-containing catalytic metal, and the thermal treatment is an annealing procedure for heating 4 hours at 550° C. under an atmosphere of a hydrogen gas or an inert gas.

Figure 3F:
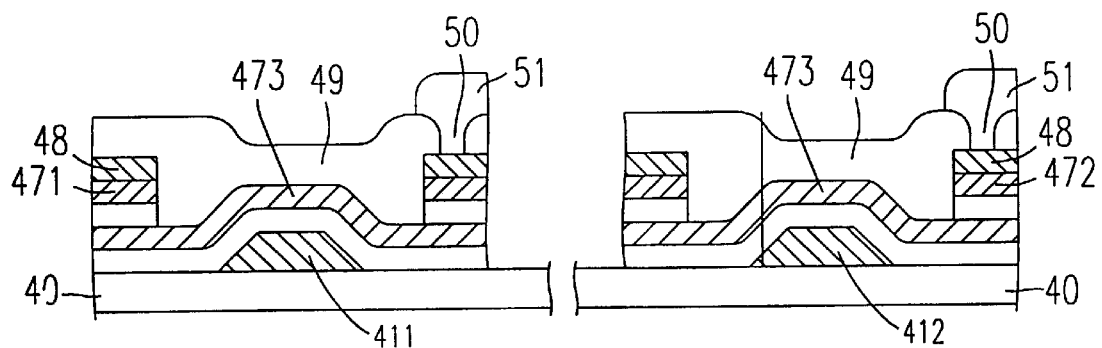

Please refer to FIG. 3(f), a conductive layer is formed and a fourth masking and patterning procedure is performed to further define a data line structure 48. Then, a fifth masking and patterning procedure is performed to define a contact hole 50 on a passivation layer 49 after forming the passivation layer 49. Finally, a transparent electrode layer is formed and a sixth masking and patterning procedure is performed to define a transparent pixel electrode region 51, thereby forming a polycrystalline thin film transistor display panel.

According to the foregoing preferred embodiments, the insulation substrates 20 and 40 are formed of transparent glasses, and the gate conductive layer can be formed of a material selected from a group consisting of chromium (Cr), molybdenum (Mo), tantalum (Ta), tantalum molybdate, tungsten molybdate, aluminum (Al), aluminum silicate and copper (Cu). The gate insulation layer can be formed of a material selected from a group consisting of silicon nitride (SiNx), silicon oxide (SiOx), silicon oxynitride (SiOxNy), tantalum oxide (TaOx) and aluminum oxide (AlOx). The data conductive layer is formed of a compound metal material selected form a group consisting of chromium/aluminum (Cr/Al) and molybdenum/aluminum (Mo/Al), and the passivation layer is principally formed of silicon nitride (SiNx).

In the above description, the process for forming polycrystalline silicon TFT-LCD according to the present invention can omit at least two masking and patterning procedures compared with the conventional process. Therefore, the present invention could reduce the manufacturing cost, shorten the product procedure time in the factory, and reduce the possibility for mis-alignment and particle pollution. The process according to the present invention could avoid employing the higher temperature used in the conventional manufacturing procedure.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What we claim is:

1. A process for forming a crystalline thin film transistor (TFT) liquid crystal display (LCD), comprising steps of:
   providing a substrate made of an insulating material;
   forming a first conductive layer on said substrate;
   performing a first masking and patterning procedure to define a gate conductive region on said substrate;
   successively forming an insulation layer, an amorphous semiconductor channel layer, a catalytic layer and a doped semiconductor layer on said substrate;
   performing a second masking and patterning procedure to remove portions of said doped semiconductor layer and said catalytic layer to define an electrode region;
   performing a thermal treatment for said substrate to respectively convert said electrode region and said amorphous semiconductor channel layer into a source/drain region and a crystalline semiconductor channel layer by said catalytic layer;
   forming a second conductive layer on said substrate and performing a third masking and patterning procedure to define a data line;
   forming a passivation layer and performing a fourth masking and patterning procedure to remove portions of said passivation for forming a contact hole accessible to said data line; and
   forming a transparent electrode layer and performing a fifth masking and patterning procedure to define a transparent pixel electrode region, thereby forming said crystalline thin film transistor.

2. The process according to claim 1, wherein said first conductive layer is a gate conductive layer.

3. The process according to claim 1, wherein said amorphous semiconductor layer is formed of an intrinsic amorphous silicon and said doped semiconductor layer is formed of a highly doped amorphous silicon.

4. The process according to claim 1, wherein said catalytic layer is formed of a catalytic metal.

5. The process according to claim 4, wherein said catalytic metal is formed of Nickel.

6. The process according to claim 1, wherein said thermal treatment is a annealing procedure for heating 4 hours at 550° C. under one of a hydrogen atmosphere and an inert gas atmosphere.

7. A process for forming a complementary thin film transistor liquid crystal display, comprising steps of:
   providing a substrate made of an insulating material;
   forming a first conductive layer on said substrate;
   performing a first masking and patterning procedure to define two gate conductive regions on said substrate;
   successively forming an insulation layer, an amorphous semiconductor channel layer, a catalytic layer, a N-type doped amorphous semiconductor layer on said substrate;
   performing a second masking and patterning procedure to remove portions of said N-type doped amorphous semiconductor layer and said catalytic layer to define a first electrode region and a second electrode region;
   forming a photoresist layer and performing a third masking and patterning procedure to expose said second electrode region;

performing a P-type doping procedure to convert the materials of said second electrode region into a P-type doped amorphous semiconductor;

performing a thermal treatment for said substrate to convert said first electrode region and said second electrode region and said amorphous semiconductor channel layer into a first source/drain region, a second source/drain region and a crystalline semiconductor layer by said catalytic layer;

forming a second conductive layer and performing a fourth masking and patterning procedure to define data lines;

forming a passivation layer and performing a fifth masking and patterning procedure to remove portions of said passivation layer to form a contact hole accessible to said data lines;

forming a transparent electrode layer and performing a sixth masking and patterning procedure to form a transparent pixel region, thereby forming said thin film transistor.

8. The process according to claim 7, wherein said amorphous semiconductor layer is formed of an intrinsic amorphous silicon and said doped semiconductor layer is formed of a highly doped amorphous silicon.

9. The process according to claim 7, wherein said catalytic layer is formed of a catalytic metal.

10. The process according to claim 9, wherein said catalytic metal is formed of Nickel.

11. The process according to claim 7, wherein said thermal treatment is a annealing procedure for heating 4 hours at 550° C. under one of a hydrogen atmosphere and an inert gas atmosphere.

12. A process for forming a complementary thin film transistor liquid crystal display, comprising steps of:

providing a substrate made of an insulating material;

forming a first conductive layer on said substrate;

performing a first masking and patterning procedure to define two gate conductive regions on said substrate;

successively forming an insulation layer, an amorphous semiconductor channel layer, a catalytic layer, a P-type doped amorphous semiconductor layer on said substrate;

performing a second masking and patterning procedure to remove portions of said P-type doped amorphous semiconductor layer and said catalytic layer to define a first electrode region and a second electrode region;

forming a photoresist layer and performing a third masking and patterning procedure to expose said second electrode region;

performing an N-type doping procedure to convert the materials of said second electrode region into an N-type doped amorphous semiconductor;

performing a thermal treatment for said substrate to convert said first electrode region and said second electrode region and said amorphous semiconductor channel layer into a first source/drain region, a second source/drain region and a crystalline semiconductor layer by said catalytic layer;

forming a second conductive layer and performing a fourth masking and patterning procedure to define data lines;

forming a passivation layer and performing a fifth masking and patterning procedure to remove portions of said passivation layer to form a contact hole accessible to said data lines;

forming a transparent electrode layer and performing a sixth masking and patterning procedure to form a transparent pixel region, thereby forming said thin film transistor.

* * * * *